United States Patent [19]

Müller

[11] Patent Number: 4,481,041
[45] Date of Patent: Nov. 6, 1984

[54] METHOD FOR PRODUCING SCHOTTKY DIODES

[75] Inventor: Jörg Müller, Zonreding, Fed. Rep. of Germany

[73] Assignee: Siemens AG, Berlin and Munich, Fed. Rep. of Germany

[21] Appl. No.: 383,266

[22] Filed: May 28, 1982

[30] Foreign Application Priority Data

Jun. 23, 1981 [DE] Fed. Rep. of Germany ....... 3124572

[51] Int. Cl.$^3$ ............................................. H01L 21/265
[52] U.S. Cl. ..................................... 148/1.5; 29/571; 29/576 B; 29/578; 29/591; 148/187; 357/91
[58] Field of Search ................... 148/1.5, 187; 29/571, 29/576 B, 578, 591; 357/91

[56] References Cited

U.S. PATENT DOCUMENTS

| 4,063,964 | 12/1977 | Peressini et al. | 148/1.5 |
| 4,084,987 | 4/1978 | Gobber | 148/1.5 |
| 4,096,622 | 6/1978 | McIver | 29/578 |
| 4,119,446 | 10/1978 | Mastroianni | 148/1.5 |
| 4,310,362 | 1/1982 | Roche et al. | 148/1.5 |
| 4,371,423 | 2/1983 | Yoshizawa et al. | 29/591 |
| 4,377,030 | 3/1983 | Pettenpaul et al. | 357/15 |

Primary Examiner—Upendra Roy
Attorney, Agent, or Firm—Herbert L. Lerner; Laurence A. Greenberg

[57] ABSTRACT

Method for manufacturing Schottky diodes which have a doped self-aligning guard ring in the fringe region of the Schottky contact in the semiconductor layer underneath, in which the guard ring is inserted into the semiconductor layer by means of implantation. Parts of a first intermediate layer applied to the semiconductor surface to be implanted as well as parts of a second intermediate layer serve as the implantation mask.

13 Claims, 6 Drawing Figures

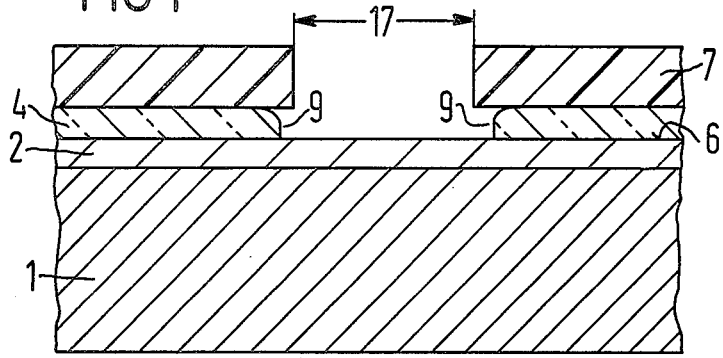
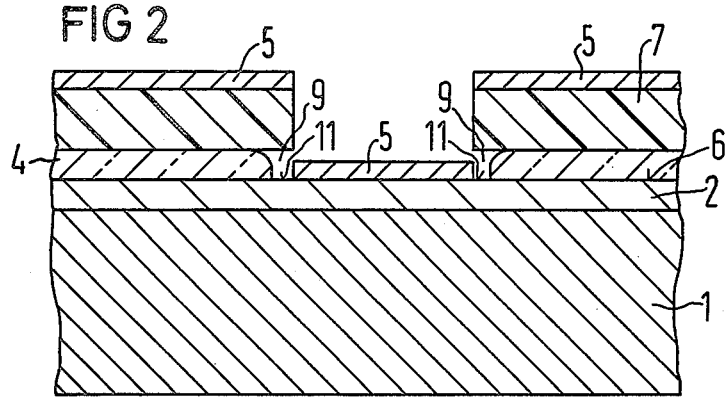
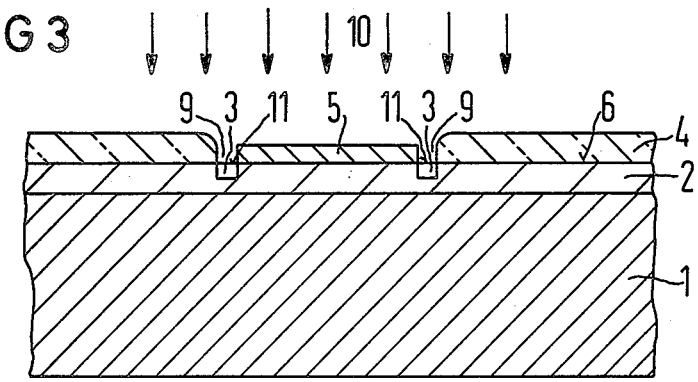

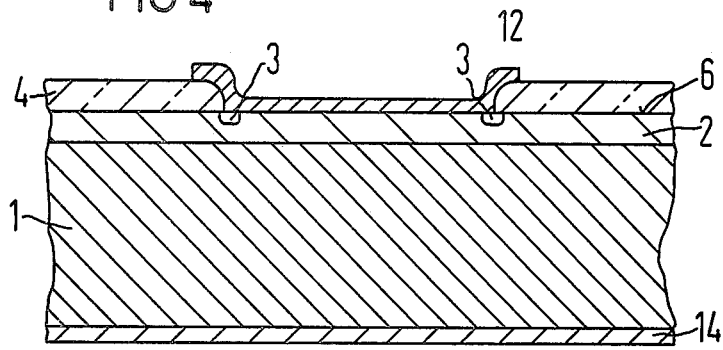
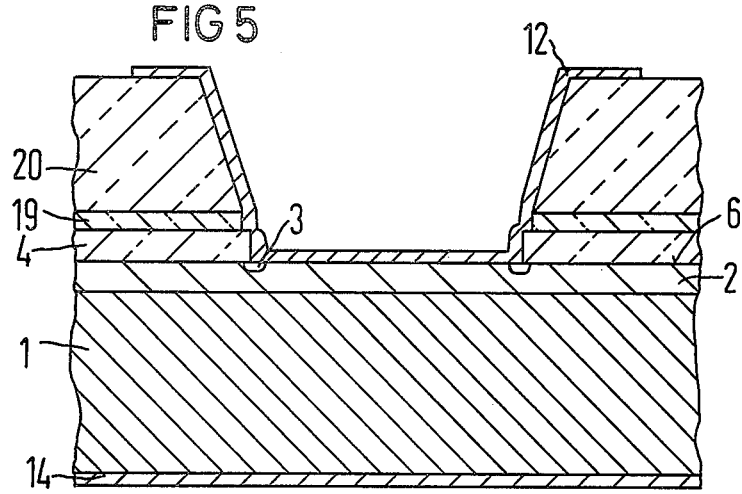
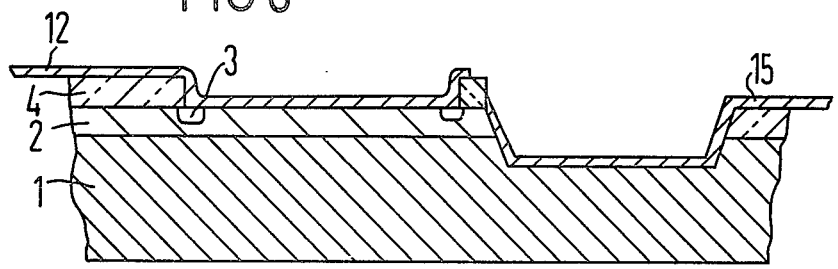

METHOD FOR PRODUCING SCHOTTKY DIODES

BACKGROUND OF THE INVENTION

1. Field of the Invention

The invention relates to a method for producing Schottky diodes which have in the fringe area of the Schottky contact a doped self-aligned guard ring in the semiconductor layer underneath.

2. Description of the Prior Art

In the manufacture of Schottky diodes with very small areas, i.e. of Schottky diodes with a diameter in the order of 10 μm, the elimination of the fringe effects presents considerable difficulties. Fringe effects cause, for instance, poor ideality, i.e. a strong deviation from the theoretical characteristic and in addition, a large cut-off current and a soft breakthrough. In large-area Schottky diodes, the undesirable fringe effects can be reduced substantially by means of a guard ring applied by means of a photomask. In Schottky diodes with a very small area however, a guard ring made by means of photomasks represents an additional capacitance so substantial that this technique cannot be used.

It has, therefore, been attempted to do without a guard ring in the manufacture of Schottky diodes with a very small area, and instead to reduce the undesirable fringe effects by means of elaborate purification methods. However, it has not been possible to produce, in a reproducible manner, Schottky diodes manufactured by such method for which reason such method is unusable.

At the conference "International Electron Device Meeting", Washington, D.C., Dec. 8-12, 1980, in a paper "A Very Small Schottky Barrier Diode (SBD) With Self-Aligned Guard Ring for VLSI Application" by Sang and Kim, consideration was given to diffuse-in a guard ring for Schottky diodes in a self-aligning manner. While the dimensions for guard rings can be reduced in small Schottky diodes by self-aligned masking, so that the additional capacitance due to the guard ring can be reduced to a tolerable level, the application of diffusion has disadvantages for small-area Schottky diodes made in this manner. The use of diffusion causes a limitation in the choice of the applicable Schottky metals and, because of out-diffusion during the diffusion process, causes a degradation of the series resistance of components. Because of the very low concentration of the doping substance in diffusing-in such guard rings, it is not possible to dope from the gaseous phase. Rather, the substantial extra cost of diffusion from the ampoule is necessary. In spite of this considerable extra cost, the reproducibility of Schottky diodes made accordingly is not assured sufficiently.

SUMMARY OF THE INVENTION

It is, therefore, an object of the invention to provide a method of producing Schottky diodes which have a doped self-aligning guard ring in the fringe region of the Schottky contact which ensures sufficient fineness of the guard ring, a sufficient degree of reproducibility, and the usability of a multiplicity of Schottky metals, and does not degrade the series resistance of the component during the doping procedure.

With the foregoing and other objects in view, there is provided in accordance with the invention a method for manufacturing Schottky diodes which have a doped self-aligning guard ring in the fringe region of the Schottky contact in the semiconductor layer underneath, the combination therewith of forming an implantation mask with openings therein to permit implantation from part of a first intermediate layer applied to the semiconductor surface to be implanted and from part of a second intermediate layer applied to the semiconductor surface to be implanted, and inserting the guard ring in the semiconductor layer beneath the mask by means of implantation through the openings in the mask into the semiconductor layer.

Other features which are considered as characteristic for the invention are set forth in the appended claims.

Although the invention is illustrated and described herein as embodied in a method for producing Schottky diodes, it is nevertheless not intended to be limited to details shown, since various modifications may be made therein without departing from the spirit of the invention and within the scope and range of equivalents of the claims.

BRIEF DESCRIPTION OF THE DRAWINGS

The invention, however, together with additional objects and advantages thereof will be best understood from the following description when read in connection with the accompanying drawings, in which:

FIG. 1 diagrammatically shows a cross section of a semiconductor wafer having a substrate of semiconductor material and a layer of epitaxially deposited semiconductor material with a photoresist mask and underetchings in the first intermediate layer, FIG. 2 shows the semiconductor wafer according to FIG. 1 with a second intermediate layer deposited thereon.

FIG. 3 shows the semiconductor wafer with the photoresist mask removed and with the implantation mask formed of part first intermediate layer and part second intermediate layer with an opening therebetween for implanting a guard ring.

FIG. 4 illustrates a Schottky diode with implanted guard ring in accordance with the invention.

FIG. 5 illustrates a Schottky diode with small capacitance and implanted guard ring in accordance with the invention, and FIG. 6 illustrates a Schottky diode with beam-lead contacts and implanted guard ring in accordance with the invention.

DETAILED DESCRIPTION OF THE INVENTION

In the manufacture of Schottky diodes which have in the fringe region of the Schottky contact, in the semiconductor layer underneath, a doped guard ring applied in a self-aligning manner, the guard ring is applied into the semiconductor layer by means of implantation. Parts of a first intermediate layer are applied on the semiconductor surface to be implanted as well as parts of a second intermediate layer, for instance of metal, serve as the implantation mask. Using implantation instead of diffusion from the ampoule has the advantage that better reproducibility of components made accordingly is obtained, and also that, for the manufacture of such components, the choice of the Schottky metals used therefor is not limited. In addition, the series resistance of Schottky diodes made accordingly is not adversely affected by the implantation, while in the case of diffusion, the series resistance gets worse, which is caused by dopings previously applied into the crystal diffusing out. The choice according to the invention of the implantation mask consisting of two intermediate layers of generally different material makes possible a very advantageous and simple further fabrication of Schottky diodes, since contacts can be applied in such manner that the geometry of the Schottky diode is not made substantially larger by the implanted guard ring, and the first intermediate layer can be left on the semiconductor surface if it acts at the same time as an insulator for the finished component.

In the production of small-area Schottky diodes, it is particularly advantageous, if the width of the guard ring is smaller than 2 μm and in particular smaller than or equal to about 1 μm. The width of a guard ring is understood in connection with Schottky diodes with circular symmetry at the outer semiconductor surface, to be the difference between the inside and the outside guard ring radius. Thereby, the additional capacitance caused by the guard ring can be kept accordingly small and all advantages of the guard ring can be achieved at the same time.

It is part of the invention that the first intermediate layer consists of etchable insulating material, for instance of silicon dioxide with a layer thickness of 0.3 μm to 2 μm, and in particular of about 1 μm. Thereby, intentional underetching can be used for manufacturing particularly finely structured implantation masks.

In order to generate Schottky diodes with a particularly thick insulating layer, it is particularly advantageous that the first intermediate layer is reinforced by means of one or several layers of the materials silicon oxide (SiO), silicon dioxide ($SiO_2$), and silicon nitride ($Si_3N_4$). A Schottky diode protected with a thick insulating layer can be made, for instance, by covering a structured first intermediate layer, 1 μm thick, of silicon dioxide ($SiO_2$) with a thin, for instance 0.05 μm to 0.2 μm thick silicon nitride layer ($Si_3N_4$), and subsequently with a, for instance, 3 to 10 μm thick silicon dioxide layer ($SiO_2$). Previously etched edges of the thin $SiO_2$-layer are not attacked in the subsequent thick-oxide etching by means of hydrofluoric acid (HF), since silicon nitride is not attacked hydrofluoric acid. Subsequent nitride etching by means of phosphoric acid ($H_3PO_4$) in turn does not attack silicon nitride so that the edges of the thin silicon dioxide layer are not attacked in this etching procedure.

It is also advantageous that the second intermediate layer consist of metal, for instance, a Schottky metal. This measure not only has the advantage of easy application or etching of the second intermediate layer, but also makes it possible to save temperature steps which, due to diffusion from dopings contained in the semiconductor, degrade the component. In addition, particularly advantageous contacting between the semiconductor and the contacts applied thereon can achieved by a suitable choice of material for the second intermediate layer, the Schottky contacts and the contacts.

It is also advantageous to use boron or phosphorus for implantation, and that the substrate and the semiconductor layer implanted consist of one of the materials selected from gallium arsenide (GaAs), indium phosphide (InP), germanium (Ge) or, preferably, silicon.

In a particularly advantageous embodiment of the method according to the invention an n-doped silicon layer is epitaxially deposited on a $n^+$-doped silicon substrate. A first intermediate layer consisting of silicon dioxide is applied to the outer surface of the epitaxially deposited silicon layer. By means of a photo-technique, using a photoresist mask, parts of the silicon surface are etched free of silicon dioxide in such a manner that underetchings are generated under the remaining photoresist masks. Thereafter a coating over the whole area with material of the second intermediate layer, consisting of metal, is performed. Thereafter, the photoresist mask with the parts of the second intermediate layer located on top of it is lifted by a lift-off technique. Thereafter ion implantation, indicated by the arrows 10 in FIG. 3, into the silicon surface parts exposed by the underetching, is carried out to generate the guard ring. The parts of the second intermediate layer are removed from the surface. Subsequently, the implanted guard ring is activated. Finally, Schottky contacts are applied to cover the semiconductor surface parts free of silicon dioxide ($SiO_2$) such that at least the subregion adjacent to the Schottky contact of the guard ring is covered by the Schottky metal.

The invention will be explained in further detail in the following, making reference to the drawings, and with the aid of embodiment examples.

FIG. 1 shows a substrate 1 which usually consists of semiconductor material, with a semiconductor layer 2 which is deposited thereon epitaxially. On the epitaxially deposited semiconductor layer 2, a first intermediate layer 4 is applied which is covered by a photoresist mask 7. In the gaps 17 of the photoresist mask 7, the first intermediate layer 4 underneath is etched off down to outer surface 6 of the epitaxially deposited semiconductor layer 2. At the edges of the photoresist mask 7 within the gaps 17, underetchings 9 are applied in the first intermediate layer 4 underneath in a targeted manner. The substrate may, for instance, consist of $n^+$-doped silicon, while the silicon layer 2 may consist of n-doped silicon. This choice of material, however, is not mandatory. The substrate 1 and the semiconductor layer 2 may also have mirror-symmetrical p-doping or consist of different semiconductor material such as, for instance, germanium (Ge), gallium arsenide (GaAs) or indium phosphide (InP). The first intermediate layer 4 can consist of any desired insulator, particularly of silicon dioxide ($SiO_2$).

In the following figures, like objects as described in FIG. 1, are designated with the same reference symbols and will therefore not be explained again.

FIG. 2 shows a semiconductor wafer according to FIG. 1, in which the second intermediate layer 5 is deposited on the photoresist mask 7 and in the gaps 17 of the photoresist mask 7 over the entire surface. The second intermediate layer 5 may consist, for instance, of metal, particularly of Schottky metal. Due to the underetchings 9, surface parts 11 of the semiconductor layer 2 remain free of the first intermediate layer 4 as well as of the second intermediate layer 5, in the overall coating by the second intermediate layer 5.

FIG. 3 shows a semiconductor layer like FIG. 2, in which the photoresist mask 7 with parts of the second intermediate layer 5 above are removed, for instance, by a lift-off technique. Thus, there remains an implantation mask for the guard ring 3, formed of parts of the first intermediate layer 4 and the second intermediate layer 5. The implantation is indicated by the arrows 10. For instance, boron or phosphorus can be used for the implantation. In the case of an $n^+$-doped substrate 1 and an n-doped epitaxially deposited semiconductor layer 2, the guard ring 3 has p-doping, caused, for instance, by means of boron implantation.

FIG. 4 shows a semiconductor wafer as in FIG. 3, in which the remaining parts of the second intermediate layer 5 were removed and Schottky contact metals 12 were applied in their stead. In addition, backside contacts 14 in the form of a substrate metallization are applied. The Schottky contact 12 is applied so that it makes contact with the semiconductor layer 2 within the guard ring 3 as well as covers the first p-n-junction adjacent to this region, between the guard ring and the semiconductor layer 2, while the second one, the outer p-n-junction between the guard ring 3 and the semiconductor layer 2, is covered by the first intermediate layer 4, an insulating layer. The Schottky contact 12 is covered as a rule by one or several metal layers, whereby a particularly advantageous contact is achieved. These further metal layers of the Schottky contact 12, however, are not shown in FIGS. 4 to 6.

FIG. 5 differs from FIG. 4 in that the first intermediate layer 4 is reinforced by means of two further layers. Specifically, there is on the surface 6 of the semiconductor layer 2, as the intermediate layer 4, a silicon dioxide layer ($SiO_2$), 0.3 $\mu$m to 2 $\mu$m thick, and particularly 1 $\mu$m thick and over it again a silicon nitride layer 19, 0.05 $\mu$m to 0.2 $\mu$m thick ($Si_3N_4$) and on top thereof again a thick oxide layer 20 about 3 $\mu$m to 10 $\mu$m thick consisting of silicon dioxide ($SiO_2$). Schottky diodes with small capacitance can be produced with such thick-layer insulating layers.

FIG. 6 differs from FIG. 4 in that, for obtaining beam lead structures in Schottky diodes instead of a backside contact, the substrate is contacted by means of the contact 15 from the same surface, on which the Schottky contact 12 is applied. To realize beam lead structures, it is furthermore necessary to extend a Schottky contact 12 on one side far and beyond the intermediate layer 4. Also in beam lead structures, as shown in FIG. 6, the first intermediate layer 4 may be reinforced by means of one or several insulating layers, as shown in FIG. 5. Beam-lead structures have the advantage that a housing can be dispensed with and that the parasitic capacities and the parasitic inductances are smaller in the beam-lead Schottky diodes than in corresponding Schottky diodes of different design.

A Schottky diode according to the invention, is manufactured by epitaxially depositing an n-doped silicon layer 2, for instance, on an n-doped silicon substrate. On the outer surface 6 of the epitaxially deposited silicon layer 2, a first intermediate layer 4, for instance consisting of silicon dioxide ($SiO_2$) in a layer thickness of 0.3 $\mu$m to 2 $\mu$m, and in particular about 1 $\mu$m is applied on the outer surface 6. The structures of the Schottky diodes, for instance, with a diameter of 3 $\mu$m to 20 $\mu$m, are etched through the silicon dioxide layer down to the semiconductor surface 6 of the epitaxially deposited layer 2 by means of a photoresist mask 7 deposited thereon. Such etching produces in the silicon dioxide layer, underetchings of about 1 $\mu$m as measured from the edge of the photoresist mask to the silicon dioxide boundary of the semiconductor surface. Subsequently, a vapor deposition over the entire surface of the semiconductor wafer with a second intermediate layer 5, for instance, consisting of metal, particularly Schottky metal, is carried out. In the process, metal deposits on the photoresist masks as well as on the semiconductor surface in the gaps of the photomask 7. The semiconductor surface 6 within the underetchings 9, however, remains free of the metal layer as well as of the silicon dioxide layer. Thereafter, the photoresist mask 7 as well as the metal layer 5 deposited thereon is removed, from the surface of the wafers for instance, by means of lift-off technique. Remaining on the semiconductor wafer is a mask consisting of parts of the vapor-deposited metal layer 5 as well as of silicon dioxide parts 4. Both parts of the mask have gaps of about 1 $\mu$m with respect to each other, which gaps were produced by the targeted underetching. Thereafter, the wafer is subjected to ion implantation 10 to effect guard ring doping underneath the underetched gaps. In the case of $n^+$-doped silicon substrate 1 and n-doped epitaxially deposited semiconductor layer 2, the guard ring 3 is given p-doping, for instance, by means of boron implantation. Subsequently, the remaining parts of the metal layers 5 are removed. The Schottky contacts are applied after a healing process and activation of the guard ring 3. In Schottky diodes of larger capacitance, this application follows immediately. In the case of Schottky diodes with small capacitance, a coating over the entire surface is performed prior to applying the Schottky diodes, first with silicon nitride ($Si_3N_4$) in a layer thickness of 0.05 $\mu$m to 2 $\mu$m, particularly about 1 $\mu$m, and thereupon the deposition of a thick silicon oxide layer consisting of silicon dioxide ($SiO_2$) with a layer thickness of about 3 $\mu$m to 10 $\mu$m. A photomask is applied subsequently on the thick silicon oxide layer. With this photomask and with, for instance, hydrofluoric acid (HF) as the etching medium, the thick oxide is etched through above the Schottky diode region down to the silicon nitride layer. After the photomask is removed, the silicon nitride layer is etched by means of phosphoric acid ($H_3PO_4$) with the silicon oxide layer as a mask. The photomask is chosen for the thick oxide layer so that the resulting openings in the thick oxide as well as in the silicon nitride are somewhat wider than the already existing opening of the lowest thin silicon dioxide layer. Subsequently, the Schottky contact is applied also in this case. The Schottky contact is applied here to cover the inner p-n-junction facing the Schottky diode between the guard ring and the semiconductor layer, while the outer p-n-junction between the guard ring and the semiconductor layer is covered by the thin silicon dioxide layer. The Schottky metal contacts are finally coated with further metal layers in order to generate particularly advantageous contacts. The substrate contact is made either as a backside contacting over the entire surface or, for instance, in the case of beam-lead structures, by sunken contacts which are applied from the same semiconductor surface as the Schottky contacts.

The invention may be employed for generating any type of Schottky diodes and is particularly well suited for the manufacture of microwave Schottky diodes.

There are claimed:

1. Method for manufacturing Schottky diodes which have a doped self-aligning guard ring in the fringe region of the Schottky contact in the semiconductor layer underneath, which comprises applying a first intermediate layer to a semiconductor surface to be implanted, covering the first intermediate layer with a photoresist mask with gaps, etching off the first intermediate layer in the gaps of the photoresist mask down to the semiconductor surface, and also underetching the first intermediate layer underneath the photoresist mask at the edges of the edges of the photoresist mask within the gaps, depositing a second intermediate metal layer on the photoresist mask and in the gaps of the photoresist mask over the entire surfaces, removing the second intermediate layer and photoresist mask except for the second intermediate metal layer in the gaps to form an implantation mask with openings therein to permit implantation, from part of the first intermediate layer applied to the semiconductor surface to be implanted and from part of the second intermediate layer applied to the semiconductor surface to be implanted, implanting the guard ring through the openings in the implanting mask in the semiconductor beneath the implanting mask, removing the remainder of the second intermediate layer, thereafter activating the implanted guard ring and subsequently covering the semiconductor surface with a Schottky metal of at least the subregion of the guard ring adjacent to the Schottky contact.

2. Method according to claim 1, wherein the width of the guard ring is smaller than 2 μm.

3. Method according to claim 1, wherein the width of the guard ring is smaller than or equal to about 1 μm.

4. Method according to claim 1, wherein the first intermediate layer consists of etchable insulating material.

5. Method according to claim 1, wherein the first intermediate layer consists of a silicon dioxide layer 0.3 μm to 2 μm thick.

6. Method according to claim 1, wherein the first intermediate layer consists of a silicon dioxide layer about 1 μm thick.

7. Method according to claim 1 or 2 or 4 or 6, wherein the first intermediate layer is reinforced by at least one layer of a material selected from the group consisting of SiO, $SiO_2$ and $Si_3N_4$.

8. Method according to claim 1, wherein said metal of the second intermediate layer is one of the Schottky metals.

9. Method according to claim 1, wherein the semiconductor layer has a substrate beneath it, and wherein the semiconductor layer and the substrate each is a material selected from the group consisting of gallium arsenide, indium phosphide, germanium and silicon.

10. Method according to claim 2, wherein the first intermediate layer consists of etchable insulating material.

11. Method according to claim 2, wherein the first intermediate layer consists of a silicon dioxide layer 0.3 μm to 2 μm thick.

12. Method according to claim 1 or 2 or 4 or 5, wherein the material used for implantation is selected from the group consisting of boron and phosphorous.

13. Method according to claim 9, wherein an n-doped silicon layer is epitaxially deposited on a $n^+$-doped silicon substrate, wherein the first intermediate layer of silicon dioxide is applied to the outer surface of the epitaxially deposited silicon layer, wherein part of the silicon surface is etched free of silicon dioxide by means of a phototechnique using a photoresist mask, wherein underetchings are produced intentionally under the photoresist mask, wherein subsequently the surface is coated with the second intermediate layer of metal, wherein subsequently the photoresist mask with the part of the second intermediate layer located on top thereof, is removed by a lift-off technique.

* * * * *